US008733856B2

United States Patent
Hsieh et al.

(10) Patent No.: US 8,733,856 B2
(45) Date of Patent: May 27, 2014

(54) SEVER ENCLOSURE WITH COVER PANEL

(75) Inventors: Chung-Cheng Hsieh, New Taipei (TW); Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 98 days.

(21) Appl. No.: 13/483,333

(22) Filed: May 30, 2012

(65) Prior Publication Data

US 2013/0099645 A1 Apr. 25, 2013

(30) Foreign Application Priority Data

Oct. 25, 2011 (TW) .............................. 100138707 A

(51) Int. Cl.
*A47B 81/00* (2006.01)
(52) U.S. Cl.
USPC ..................................... 312/223.2; 312/265.5
(58) Field of Classification Search
USPC ............. 312/223.2, 257.1, 265.5, 265.6, 324, 312/326, 327, 328, 329; 361/724, 726, 361/679.31, 679.02
See application file for complete search history.

(56) References Cited

U.S. PATENT DOCUMENTS

| 6,111,754 | A * | 8/2000 | Abbott et al. ................. 361/724 |
| 7,298,607 | B2 * | 11/2007 | Zielnicki ................... 361/679.01 |
| 7,374,259 | B2 * | 5/2008 | Wu et al. .................... 312/223.2 |
| 7,428,146 | B2 * | 9/2008 | Han ......................... 361/679.55 |
| 7,483,264 | B2 * | 1/2009 | Chen et al. ............... 361/679.57 |
| 2008/0225475 | A1 * | 9/2008 | Zhang et al. .................. 361/683 |
| 2009/0147452 | A1 * | 6/2009 | Zhang et al. ............. 361/679.02 |
| 2010/0026149 | A1 * | 2/2010 | Zhang et al. ............... 312/223.2 |
| 2010/0244639 | A1 * | 9/2010 | Chen et al. ................. 312/223.2 |
| 2013/0169128 | A1 * | 7/2013 | Chen et al. ................. 312/223.2 |

* cited by examiner

*Primary Examiner* — Daniel Rohrhoff
(74) *Attorney, Agent, or Firm* — Novak Druce Connolly Bove + Quigg LLP

(57) ABSTRACT

A server enclosure includes an enclosure body, and a cover panel located between the first side panel and the second side panel. The enclosure body includes a bottom panel, a first side panel, a second side panel extending from the bottom panel. The first side panel includes a side panel body and a mounting protrusion extending from the side panel body. The cover panel includes a connecting plate, a first cover plate pivotally mounted to the connecting plate, and a mounting element movably mounted to the first cover plate. The mounting element defines a cutout receiving the mounting protrusion. The first cover plate rotates about an axis. The mounting element moves along a first direction from a first position to a second position to enable the mounting protrusion to engage with the cutout.

14 Claims, 5 Drawing Sheets

SEVER ENCLOSURE WITH COVER PANEL

BACKGROUND

1. Technical Field

The present disclosure relates to server enclosures, and more particularly to a server enclosure with a cover panel.

2. Description of Related Art

A traditional server includes an enclosure and electronic components stored in the enclosure. The enclosure includes a cover panel. The typical cover panel must be completely disassembled when electronic components are replaced, which is inconvenient and time consuming.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
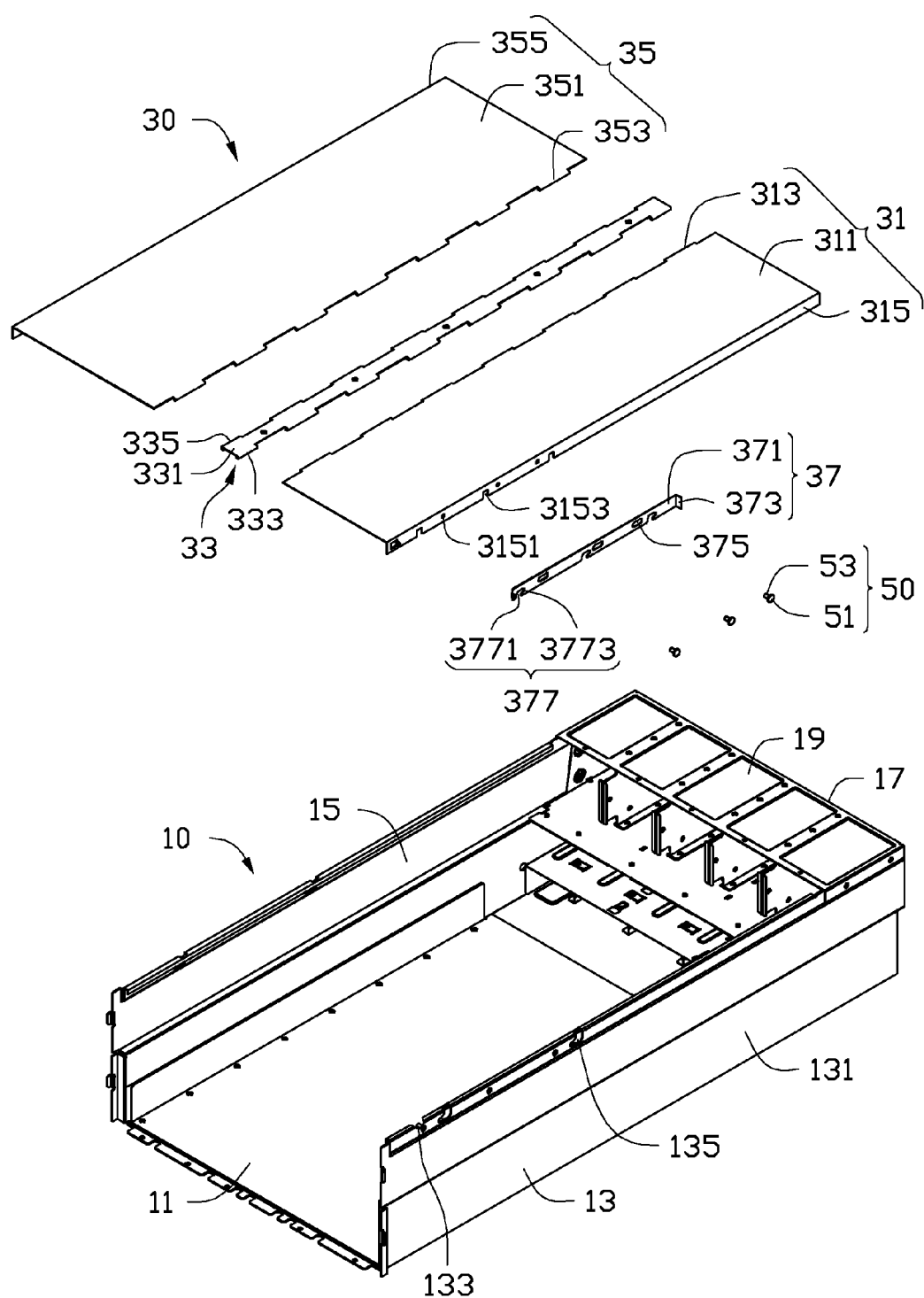
FIG. 1 is an isometric, exploded view of an embodiment of a server enclosure, the server enclosure including a cover panel.
Figure 2:
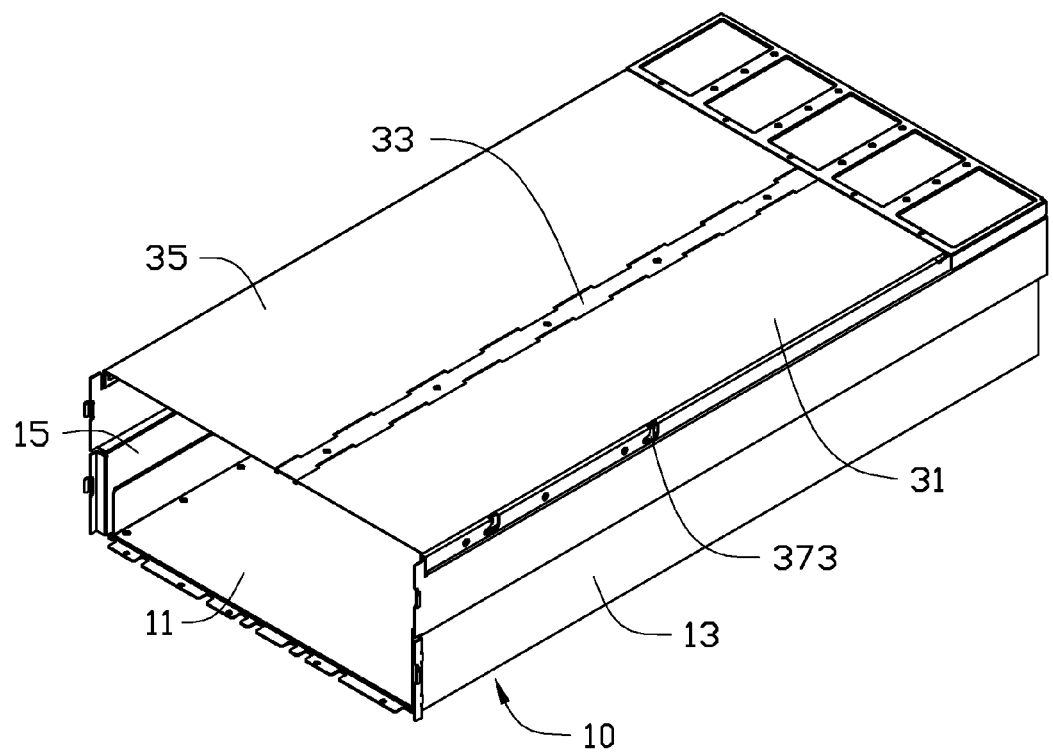
FIG. 2 is an assembled view of FIG. 1, with the cover panel shown in one state.
Figure 3:
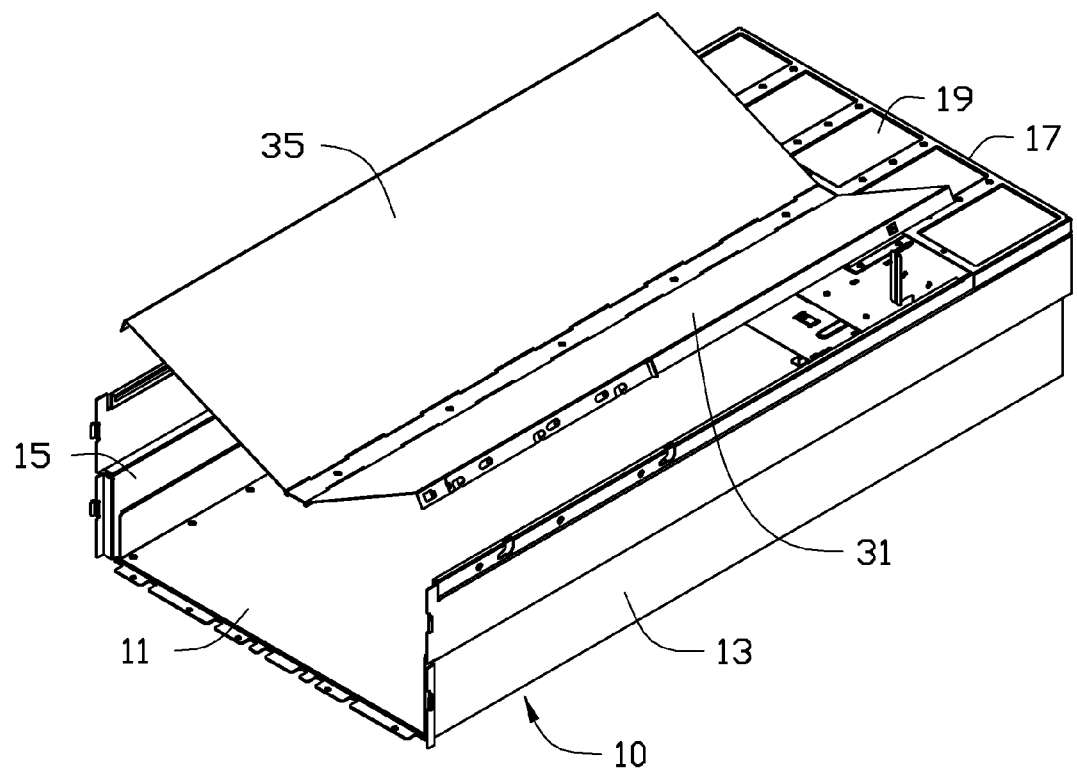
FIG. 3 is an isometric view of FIG. 1, with the cover panel of FIG. 1 shown in another state.
Figure 4:
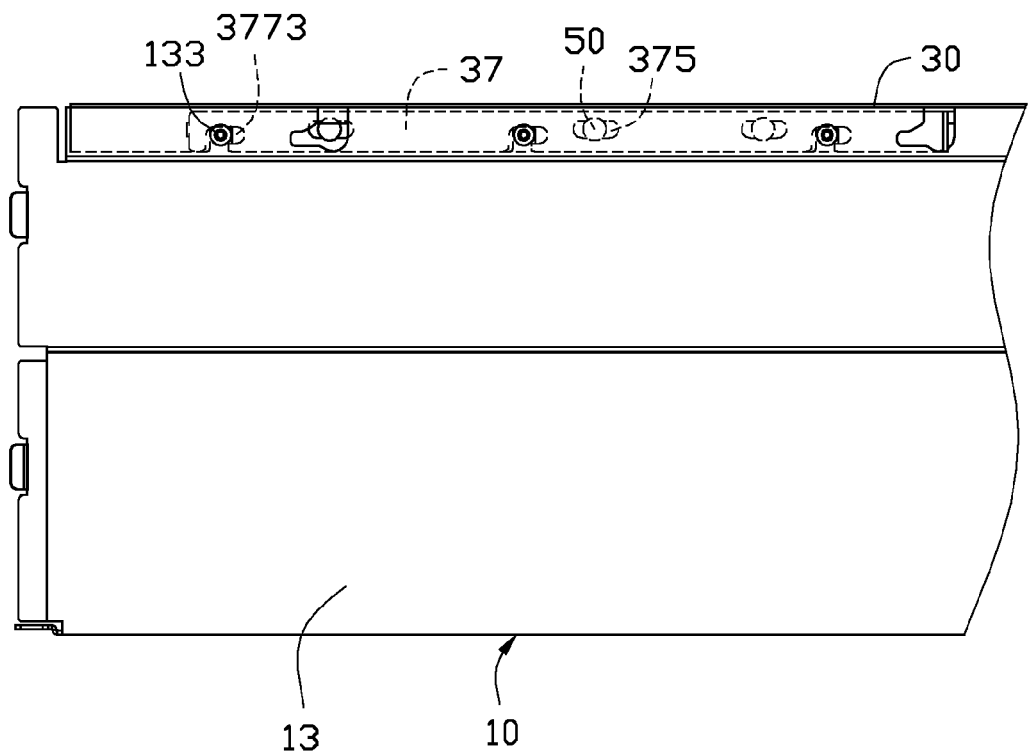
FIG. 4 is similar to FIG. 2, but viewed from another aspect and with the cover panel shown in an unlocked status.
Figure 5:
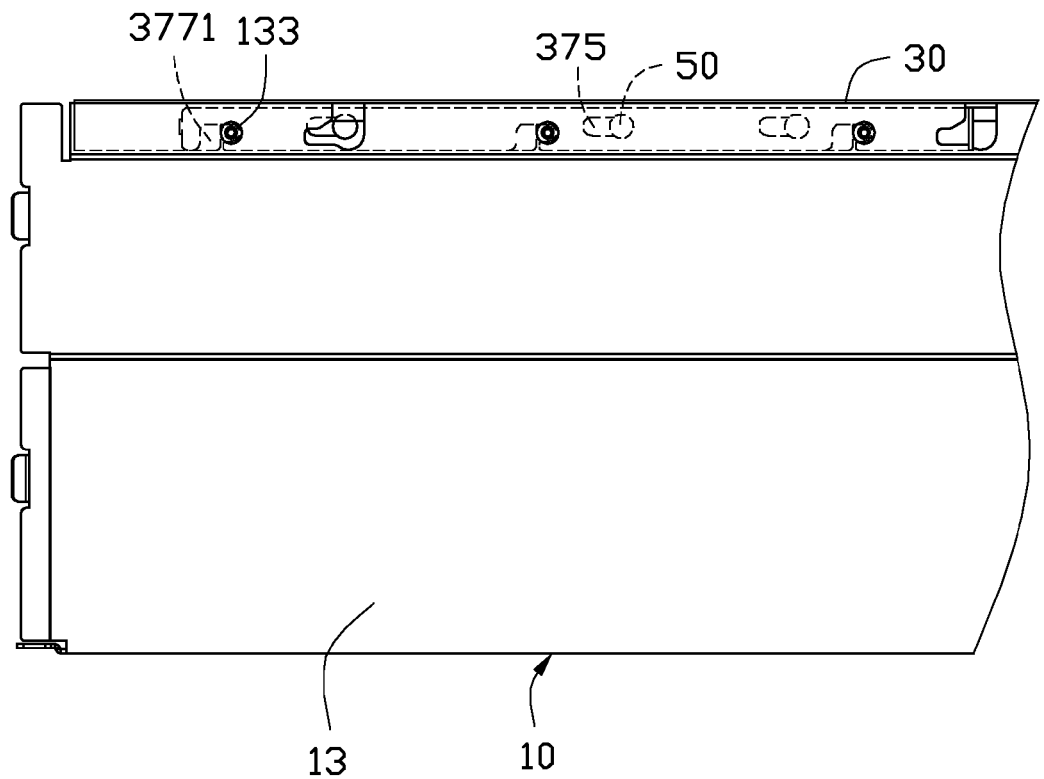
FIG. 5 is similar to FIG. 4, with the cover panel shown in a locked status.

FIG. 1, is a server enclosure of one embodiment including an enclosure body 10 and a cover panel 30. The enclosure body 10 includes a bottom panel 11, a first side panel 13, a second side panel 15, and a front panel 17 all extending from the bottom panel 11. The first side panel 13, the second side panel 15, and the front panel 17 are substantially perpendicular to the bottom panel 11. The first side panel 13 is substantially parallel to the second side panel 15. The front panel 17 is substantially perpendicular to the first side panel 13 and connected between the first and second side panels 13 and 15. The enclosure body 10 further includes a drive bracket 19 on the front panel 17. The first side panel 13 includes a side panel body 131 and a mounting protrusion 133 extending from the side panel body 131. In one embodiment, the mounting protrusion 133 is column-shaped. The side panel body 131 defines an opening 135.

The cover panel 30 includes a first cover plate 31, a connecting plate 33, a second cover plate 35, and a mounting element 37. The first cover plate 31 includes a first plate body 311, a plurality of first pivoting portions 313 extending from the first plate body 311, and a first flange 315 extending from the first plate body 311. The first flange 315 is substantially perpendicular to the first plate body 311. The first flange 315 defines a plurality of securing holes 3151 and a plurality of positioning holes 3153. The first cover plate 31 may be pivoted along an axis. In one embodiment, the first flange 315 is substantially parallel to the axis.

The second cover plate 35 includes a second plate body 351, a plurality of second pivoting portions 353 extending from the second plate body 351, and a second flange 355 extending from the second plate body 351. The second flange 355 is substantially perpendicular to the second plate body 351. The connecting plate 33 includes a connecting plate body 331, a plurality of first associating portions 333, and a plurality of second associating portions 335. The first associating portions 333 correspond to the first pivoting portions 313. The second associating portions 335 correspond to the second pivoting portions 353. The first and second associating portions 333 and 335 are located on opposite sides of the connecting plate body 331.

The mounting element 37 includes a mounting body 371 and a handle tab 373 extending from the mounting body 371. The handle tab 373 is substantially perpendicular to the mounting body 371. The mounting body 371 defines a plurality of elongated holes 375 and a plurality of cutouts 377. Each cutout 377 defines a wide part 3771 and a narrow part 3773 communicating with the wide part 3771. The handle tab 373 is mounted in the opening 135. The extending direction of the elongated hole 375 is substantially parallel to the first flange 315.

FIGS. 1-5, illustrate in assembly, the first pivoting portions 313 of the first cover plate 31 and the second pivoting portions 353 of the second cover plate 35 are pivotably mounted to the first associating portions 333 and the second associating portions 335 of the connecting plate 33. Therefore, the first cover plate 31, the second cover plate 35, and the connecting plate 33 are assembled together. The mounting element 37 is secured to the first flange 315 via a plurality of fasteners 50. Each fastener 50 includes a head portion 51 and a neck portion 53 extending from the head portion 51. Each neck portion 53 extends into the elongated hole 375 to be screwed into the securing hole 3151, thereby securing the mounting element 37 to the first flange 315. The first flange 315 is substantially parallel to the side panel body 131. The mounting element 37 moves along a direction substantially parallel to the first flange 315. The first cover plate 31 and the second cover plate 35 is rotated towards the enclosure body 10 to enable the first and second cover plate 31 and 35 and the connecting plate 35 to be in the same plane substantially parallel to the bottom panel 11. At this time, the mounting protrusion 133 is located in the positioning hole 3153 and the wide part 3771 of the cutout 377. The handle tab 373 of the mounting element 37 is located in the opening 135. The handle tab 373 is pulled along a first direction substantially parallel to the first flange 315 to enable the mounting protrusion 133 to move from the wide part 3771 to the narrow part 3773 of the cutout 377. Thereby, the first cover plate 31 is secured to the enclosure body 10.

In disassembly, the handle tab 373 is pulled along a second direction opposite to the first direction to enable the mounting protrusion 133 to move from the narrow part 3773 to the wide part 3771. The first cover plate 31 is rotated outwards to disengage from the enclosure body 10. The cover panel 30 can then be easily removed from the enclosure body 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A server enclosure, comprising:
an enclosure body comprising a bottom panel, a first side panel, and a second side panel extending from the bottom panel; and
a cover panel located between the first side panel and the second side panel, wherein the first side panel comprises a side panel body and a mounting protrusion extending from the side panel body; the cover panel comprises a connecting plate, a first cover plate pivotally mounted to the connecting plate, and a mounting element movably mounted to the first cover plate; the mounting element defines a cutout configured to receive the mounting protrusion; the first cover plate is configured to be rotated about an axis; the first cover plate is configured to rotate to enable the mounting element to be located in a first position; the mounting element is configured to move along a first direction from the first position to a second position to drive the cutout to receive the mounting protrusion thereby enabling the mounting protrusion to engage with the cutout to secure the first cover plate to the first side panel, and the first direction is substantially parallel to the axis.

2. The server enclosure of claim 1, wherein the first cover plate comprises a first plate body and a first flange extending from the first plate body; the first flange defines a securing hole and an elongated hole; an extending direction of the elongated hole is substantially parallel to the first direction; and a fastener extends through the elongated hole to engage in the securing hole to secure the mounting element to the first flange and to enable the mounting element to move along the first direction relative to the first flange.

3. The server enclosure of claim 2, wherein the mounting element comprises a mounting body and a handle tab extending substantially perpendicularly from the mounting body; the elongated hole is defined in the mounting body; the first side panel defines an opening; and the handle tab is received in the opening and movable in the opening along the first direction.

4. The server enclosure of claim 3, wherein the extending direction of the elongated hole is substantially parallel to the side panel body.

5. The server enclosure of claim 3, wherein the first flange is substantially parallel to the side panel body.

6. The server enclosure of claim 1, wherein the cover panel further comprises a second cover plate pivotally mounted to the connecting plate and on the second side panel.

7. The server enclosure of claim 6, wherein the first cover plate and the second cover plate are located on opposite sides of the connecting plate and capable of being in a same plane with the connecting plate.

8. The server enclosure of claim 1, wherein the cutout defines a wide part and a narrow part communicating with the wide part; the mounting protrusion is located in the wide part to enable the mounting protrusion to disengage from the cutout when the mounting element is in the first position; and the mounting protrusion is located in the narrow part to enable the mounting protrusion to engage with the cutout when the mounting element is in the second position.

9. A server enclosure, comprising:
an enclosure body comprising a bottom panel, a first side panel, a second side panel; and
a cover panel comprising a connecting plate, a first cover plate, a second cover plate, and a mounting element movably mounted to the first cover plate, wherein the first side panel and the second side panel extend substantially perpendicularly from the bottom panel; the first side panel comprises a side panel body and a mounting protrusion extending from the side panel body; the first cover plate and the second cover plate are pivotally mounted on opposite sides of the connecting plate; the first cover plate, the second cover plate, and the connecting plate are capable of being in a same plane substantially parallel to the bottom panel; the mounting element defines a cutout configured to receive the mounting protrusion; the first cover plate is configured to rotate to enable the mounting element to be located in a first position; the mounting element is configured to move along a first direction from the first position to a second position to drive the cutout to receive the mounting protrusion, thereby enabling the mounting protrusion to engage with the cutout to secure the first cover plate to the first side panel.

10. The server enclosure of claim 9, wherein the first plate comprises a first plate body and a first flange extending from the first plate body; the first flange defines a securing hole and an elongated hole, an extending direction of the elongated hole is substantially parallel to the first direction; and a fastener extends through the elongated hole to engage in the securing hole to secure the mounting element to the first flange and to enable the mounting element to move along the first direction relative to the first flange.

11. The server enclosure of claim 10, wherein the mounting element comprises a mounting body and a handle tab extending substantially perpendicularly from the mounting body; the elongated hole is defined in the mounting body; the first side panel defines an opening; and the handle tab is received in the opening and movable in the opening along the first direction.

12. The server enclosure of claim 11, wherein the extending direction of the elongated hole is substantially parallel to the side panel body.

13. The server enclosure of claim 11, wherein the first flange is substantially parallel to the side panel body.

14. The server enclosure of claim 9, wherein the cutout defines a wide part and a narrow part communicating with the wide part; the mounting protrusion is located in the wide part to enable the mounting protrusion to disengage from the cutout when the mounting element is in the first position; and the mounting protrusion is located in the narrow part to enable the mounting protrusion to engage with the cutout when the mounting element is in the second position.

* * * * *